(12) United States Patent
Maul

(10) Patent No.: US 7,162,886 B2
(45) Date of Patent: Jan. 16, 2007

(54) REFRIGERATING APPLIANCE COMPRISING A REFRIGERANT CIRCULATION DEVICE

(75) Inventor: Joachim Maul, Ehringshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 298 days.

(21) Appl. No.: 10/493,343

(22) PCT Filed: Sep. 13, 2002

(86) PCT No.: PCT/EP02/10283

§ 371 (c)(1),
(2), (4) Date: Apr. 22, 2004

(87) PCT Pub. No.: WO03/036206

PCT Pub. Date: May 1, 2003

(65) Prior Publication Data

US 2005/0081546 A1  Apr. 21, 2005

(30) Foreign Application Priority Data

Oct. 23, 2001 (DE) ................................ 101 52 239

(51) Int. Cl.
*F25D 23/12* (2006.01)
(52) U.S. Cl. ........................................ 62/259.2; 62/3.6
(58) Field of Classification Search ............... 62/259.2, 62/3.2, 3.3, 3.6; 165/80.4; 361/699
See application file for complete search history.

(56) References Cited

U.S. PATENT DOCUMENTS

| | | |
|---|---|---|
| 2,391,507 A | 12/1945 | Philipp |
| 2,669,853 A | 2/1954 | Spiegelhalter |
| 5,504,924 A | 4/1996 | Ohashi et al. |

FOREIGN PATENT DOCUMENTS

| | | |
|---|---|---|
| DE | 481667 | 8/1929 |
| DE | 30 02 261 A | 7/1981 |
| DE | 37 10 566 C2 | 3/1990 |
| DE | 31 36 226 C3 | 2/1991 |
| DE | 195 31 310 A1 | 2/1997 |
| DE | 198 04 901 A1 | 8/1999 |
| DE | 199 21 554 C2 | 11/2000 |
| DE | 100 07 467 A1 | 8/2001 |
| EP | 0 747 953 A2 | 12/1996 |
| EP | 0 489 326 B1 | 5/1999 |
| GB | 814252 | 6/1959 |
| WO | 91 06995 | 5/1991 |

*Primary Examiner*—Melvin Jones
(74) *Attorney, Agent, or Firm*—Pauley Petersen & Erickson

(57) ABSTRACT

A refrigerating appliance having a refrigerant circulation device arranged in the housing of the appliance and including a compressor, an evaporator, and a condenser having an inner circuit and an outer circuit. The inner circuit is in communication with a region to be cooled, preferably the inner region of a control box, by a lateral wall of the appliance housing, an air inlet and an air outlet, the evaporator being associated with the inner circuit and the condenser of the refrigerant circulation device being associated with the outer circuit. According to this invention, all of the lateral walls, except the lateral wall comprising the air inlet and the air outlet of the appliance housing, are fully closed, and the condenser is formed as a base plate with integrated refrigerant lines. The base plate forms at least part of a lateral wall of the appliance housing. Refrigerating ribs protrude on the outer side thereof. Thus, the refrigerating appliance has a structure with a system of protection IP 55 or higher, without impairing the function.

20 Claims, 2 Drawing Sheets

REFRIGERATING APPLIANCE COMPRISING A REFRIGERANT CIRCULATION DEVICE

BACKGROUND OF THE INVENTION

1. Field of the Invention

This invention relates to a cooling device with a coolant circuit placed in a device housing and having a compressor, an evaporator and a condenser having an inner circuit and an outer circuit, wherein the inner circuit is connected through a lateral wall of the device housing by an air inlet opening and an air outlet opening with a space to be cooled, preferably an interior of a switchgear cabinet, and the inner circuit is associated with the evaporator and the outer circuit with the evaporator of the coolant circuit.

2. Discussion of Related Art

Known cooling devices, which are installed on a switchgear cabinet housing or a lateral wall of the switchgear cabinet housing, are in various types of construction and developments, and therefore various cooling outputs. A fan is assigned to the condenser for cooling, which aspirates fresh air from the vicinity of the cooling device housing and conveys it into the interior of the cooling device housing. This construction has one disadvantage that, in spite of a close installation on or at the cooling device housing, it is not tightly sealed and cannot be designed in accordance with protective type IP 55 or greater. This is of a particular disadvantage if the switchgear cabinet with the cooling device is exposed to the atmosphere.

Heat exchangers are known, wherein a liquid and air are used as heat exchanging media. In this case the heat exchanger represents a plate-shaped base body with fluid outputs, which has cooling ribs and is used as the support for heat-emanating electrical circuits, such as shown in European Patent Reference EP 0 747 953 A2.

SUMMARY OF THE INVENTION

It is one object of this invention to provide a cooling device of the type mentioned above, but that it is possible for the device housing completely sealed, except for the air inlet opening and the air outlet opening, and in accordance with protective type IP 55 or greater.

In accordance with this invention, this object is achieved with all lateral walls, except for the lateral wall with the air inlet opening and air outlet opening of the device housing, are completely sealed, and the compressor is embodied as a base plate with embedded coolant lines and forms at least a part of the lateral wall of the housing, and formed-on cooling ribs protrude out of the exterior.

With this embodiment the fan, which is normally associated through the outer circuit with the compressor, can be omitted. An air-conducting connection between the interior of the cooling device and the exterior is no longer required, because the compressor designed in this manner can be installed absolutely sealed in the device housing, and the heat supplied via the coolant can be discharged through the cooling ribs arranged in the ambient air. A sufficient surface is available on the lateral walls of the device housing for achieving a sufficient cooling output with this type of a compressor. The airconditioning device can be tightly connected to a switchgear cabinet, wherein the exposed lateral housing walls are hermetically sealed, and it is possible to achieve a protective type in accordance with IP 55 or greater.

The connection of the cooling device to the switchgear cabinet is preferably provided so that the lateral wall with the air inlet opening and the air outlet opening is connected by sealing elements with the space to be cooled, in particular the switchgear cabinet housing enclosing the interior of the switchgear cabinet, wherein the air inlet opening of the cooling device is aligned with the air outlet opening of the switchgear cabinet housing, and the air outlet opening of the cooling device with the air inlet opening of the switchgear cabinet housing.

The heat transfer from the coolant to the base plate of the condenser is improved because the coolant lines are embedded in the form of a condensing coil in the base plate of the condenser.

For a simple structure of the condenser, the coolant lines are embedded in receiving grooves in the base plate of the condenser, which are cut in the surface of the base plate facing the cooling device interior. In this case the feeding and removal of the coolant can take place so that the coolant lines are introduced into the area of the upper part of the base plate and exit in the area of the lower part of the base plate.

If an exterior fan is assigned to the cooling ribs of the condenser, and an interior fan is assigned to the condenser inside the cooling device, it is possible to increase the cooling output without negatively affecting the protective type of the cooling device.

The structure of the coolant circuit with a pressure monitor, a filtering and drying device and a relief valve can be maintained in a known manner.

A construction with good cooling output, wherein a material is selected which has been shown to be particularly suitable, is distinguished because the base plate with the cooling ribs formed on it is made of aluminum, and the coolant lines are copper tubes. Other materials can also be used, for example the base plate can be made of copper or another special steel with different heat transfer characteristics.

BRIEF DESCRIPTION OF THE DRAWINGS

This invention is explained in greater detail in view of an exemplary embodiment represented in the drawings, wherein.

DESCRIPTION OF PREFERRED EMBODIMENTS

Figure 1:
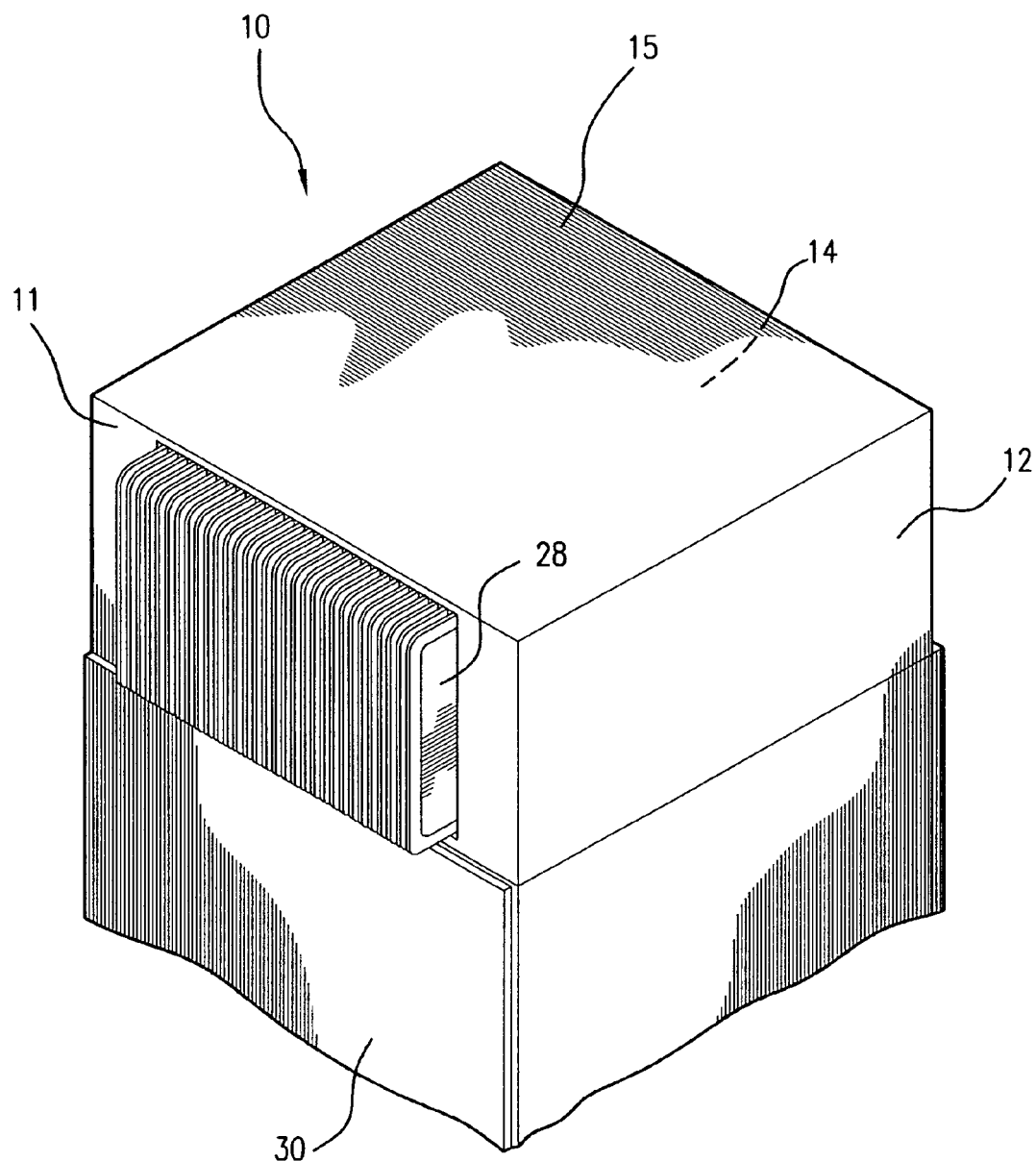
FIG. 1 shows a cooling device built on top of a switchgear cabinet housing in a perspective view.

As the plan view of FIG. 1 shows a cooling device with the closed device housing 10 can be tightly connected with a bottom 16 of the device housing 10, not visible, with the cover of the switchgear cabinet housing 30, wherein known sealing elements can also provide an electrical connection of the two housings. The transition can be easily designed so that it complies with protective type IP 55 or greater. The remaining lateral walls 11, 12, 13, 14 and 15 of the device housing 10 also meet these requirements, because an air-conducting connection from the exterior to the cooling device interior is not required at any location. Only cooling ribs 28 of a condenser 26 of the coolant circuit which, however, is integrated into the lateral wall 11 in a hermetically sealed manner and which is later explained, project away from the lateral wall 11.

Figure 2:
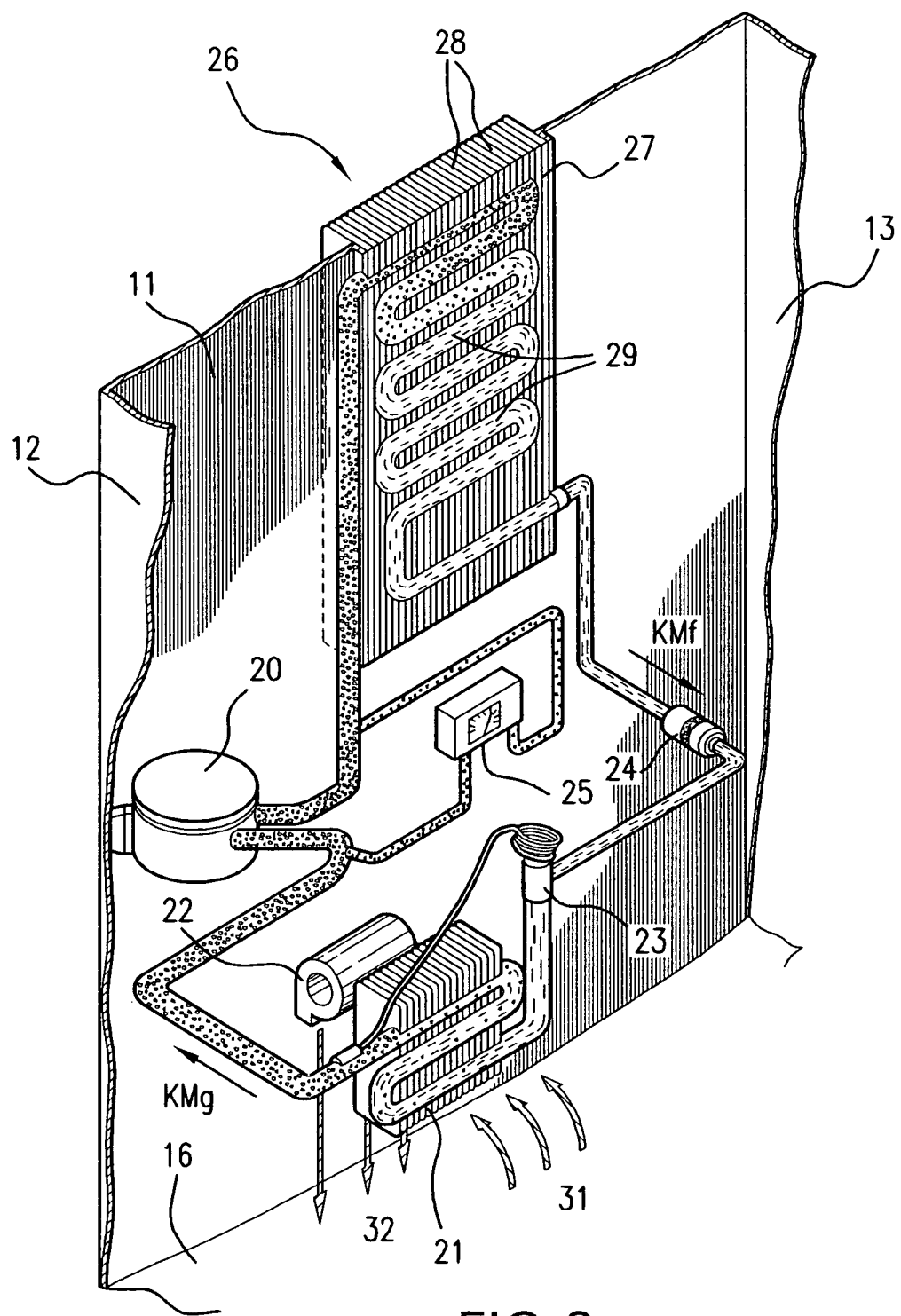
FIG. 2 is a schematic view of a structure of the cooling device.

As FIG. 2 shows, the coolant circuit has as main components a compressor 20, a condenser 26 and an evaporator 21. Hot air is conveyed out of the switchgear cabinet interior through the air inlet opening 31 in the bottom 16, which is aligned with an air outlet opening of the switchgear cabinet cover, with the aid of a fan 22 and guided over the evaporator 21. The coolant KM flowing through the evaporator 21 is supplied in gas form and superheated to the condenser 26 via the compressor 20. This condenser 26 has a base plate 27, which is fixedly and irremovably installed in the lateral wall 11, and which only projects away from the exterior of the device housing 10 with cooling ribs 28, as shown in FIG. 1. The superheated coolant flows through coolant lines 29 in the shape of a cooling coil, which is inserted into receiving grooves on the side of the base plate 27 facing the cooling device interior.

The coolant lines 29, which are preferably embodied as copper tubing, are in a good heat-conducting contact with the ground plate 27 made of aluminum. The coolant transfers the heat to the base plate 27 with the cooling ribs 28 formed thereon, which radiate the heat into the ambient air. In this case it is possible to increase the heat output with a fan assigned to the cooling ribs 28. The coolant KM leaving the condenser 26 is liquid and supercooled and flows back to the evaporator 21 via a filtering and drying device 24.

A pressure monitor 25 monitors the pressure difference between the coolant at the inlet of the compressor 20 and the outlet of the condenser 26. It is possible to introduce a relief valve 23 into the coolant circuit between the filtering and drying device 24 and the evaporator 21.

The condenser 26 covers at least a portion of the lateral wall 11 with its base plate 27, however, depending on the required cooling output it can also form the entire lateral wall 11, or can be distributed over partial areas of several lateral walls. Thus it is important for the base plate 27 to be installed, seamlessly and hermetically sealed, in the device housing 10 and to close it off airtight toward the environment.

The invention claimed is:

1. A cooling device with a coolant circuit placed in a device housing and having a compressor, an evaporator and a condenser with an inner circuit and an outer circuit, wherein the inner circuit is connected through a lateral wall of the device housing by an air inlet opening and an air outlet opening with a space to be cooled, including an interior of a switchgear cabinet, and the inner circuit is associated with the evaporator and the outer circuit with the evaporator of the coolant circuit, the cooling device comprising:

a plurality of first lateral walls (11, 12, 13, 14, 15), except for a second lateral wall (16) having an air inlet opening (31) and an air outlet opening (32) of the device housing (10), completely sealed, and the compressor (26) embodied as a base plate (27) with embedded coolant lines (29) and forming at least a part of the lateral wall (11) of the housing (10) and formed-on cooling ribs (28) protruding out of the exterior.

2. The cooling device in accordance with claim 1, wherein the first lateral walls (11, 12, 13, 14, 15) seal the device housing (10) in accordance with a protective type IP 55 or greater.

3. The cooling device in accordance with claim 2, wherein the second lateral wall (16) with the air inlet opening (31) and the air outlet opening (32) is connected by sealing elements with a space to be cooled, wherein the air inlet opening (31) of the cooling device is aligned with the air outlet opening (32) of the switchgear cabinet housing (30), and the air outlet opening (32) of the cooling device is aligned with the air inlet opening (31) of the switchgear cabinet housing (30).

4. The cooling device in accordance with claim 3, wherein the coolant lines (29) are embedded in a form of a condensing coil in the base plate (27) of the condenser (26).

5. The cooling device in accordance with claim 4, wherein the coolant lines (29) are embedded in receiving grooves in the base plate (27) of the condenser (26) which are cut in a surface of the base plate (27) facing a cooling device interior.

6. The cooling device in accordance with claim 5, wherein the coolant lines (29) are introduced into an area of an upper part of the base plate (27) and exit in a second area of the lower part of the base plate (27).

7. The cooling device in accordance with claim 6, wherein an exterior fan is assigned to the cooling ribs (28) of the condenser (26), and an interior fan (21) is assigned to the condenser (21) inside the cooling device.

8. The cooling device in accordance with claim 7, wherein the coolant circuit has a pressure monitor (25) which monitors a pressure difference between the coolant at an inlet of the compressor (20) arranged upstream of the condenser (26) and a coolant outlet of the condenser (26) arranged downstream of the compressor (20).

9. The cooling device in accordance with claim 8, wherein upstream of the evaporator (21) which is arranged downstream of the condenser (26) the coolant is conducted over a filtering and drying device (24).

10. The cooling device in accordance with claim 9, wherein a valve (23) is arranged downstream of the filtering and drying device (24).

11. The cooling device in accordance with claim 10, wherein the base plate (27) with the formed on cooling ribs (28) is made of aluminum, and the coolant lines (29) are copper tubes.

12. The cooling device in accordance with claim 1, wherein the second lateral wall (16) with the air inlet opening (31) and the air outlet opening (32) is connected by sealing elements with a space to be cooled, wherein the air inlet opening (31) of the cooling device is aligned with the air outlet opening (32) of the switchgear cabinet housing (30), and the air outlet opening (32) of the cooling device is aligned with the air inlet opening (31) of the switchgear cabinet housing (30).

13. The cooling device in accordance with claim 1, wherein the coolant lines (29) are embedded in a form of a condensing coil in the base plate (27) of the condenser (26).

14. The cooling device in accordance with claim 13, wherein the coolant lines (29) are embedded in receiving grooves in the base plate (27) of the condenser (26) which are cut in a surface of the base plate (27) facing a cooling device interior.

15. The cooling device in accordance with claim 4, wherein the coolant lines (29) are introduced into an area of an upper part of the base plate (27) and exit in a second area of the lower part of the base plate (27).

16. The cooling device in accordance with claim 1, wherein an exterior fan is assigned to the cooling ribs (28) of the condenser (26), and an interior fan (21) is assigned to the condenser (21) inside the cooling device.

17. The cooling device in accordance with claim 1, wherein the coolant circuit has a pressure monitor (25) which monitors a pressure difference between the coolant at an inlet of the compressor (20) arranged upstream of the condenser (26) and a coolant outlet of the condenser (26) arranged downstream of the compressor (20).

18. The cooling device in accordance with claim 1, wherein upstream of the evaporator (21) which is arranged downstream of the condenser (26) the coolant is conducted over a filtering and drying device (24).

19. The cooling device in accordance with claim 1, wherein a valve (23) is arranged downstream of a filtering and drying device (24).

20. The cooling device in accordance with claim 1, wherein the base plate (27) with the formed on cooling ribs (28) is made of aluminum, and the coolant lines (29) are copper tubes.

\* \* \* \* \*